United States Patent [19]

Sakamoto

[11] 4,441,085
[45] Apr. 3, 1984

[54] SIGNAL AMPLIFYING APPARATUS
[75] Inventor: Hideto Sakamoto, Tokyo, Japan
[73] Assignee: Trio Kabushiki Kaisha, Tokyo, Japan
[21] Appl. No.: 293,840
[22] Filed: Aug. 18, 1981
[30] Foreign Application Priority Data
  Aug. 20, 1980 [JP] Japan .............................. 55-117616[U]
[51] Int. Cl.³ ............................................. H03F 1/34
[52] U.S. Cl. ..................................... 330/293; 330/103;
                                                        330/110; 330/207 P
[58] Field of Search ..................... 330/110, 207 P, 298,
                                         330/103, 293, 105, 112; 381/121
[56] References Cited
  FOREIGN PATENT DOCUMENTS
    2659044  7/1978  Fed. Rep. of Germany ...... 330/298

*Primary Examiner*—James B. Mullins
*Assistant Examiner*—Gene Wan
*Attorney, Agent, or Firm*—Gerald J. Ferguson, Jr.; Joseph J. Baker

[57] ABSTRACT

In a signal amplifying apparatus which is provided with a amplifier, a feedback circuit having its input connected via a CR circuit to the output of the amplifier and its output connected to the input of the amplifier, a first terminal connected with the output of the amplifier for connection with a first cord connected with the input of a load, and a second terminal connected with the input of the feedback circuit for connection with a second cord connected with the input of the load, there are provided means for detecting whether the second cord is connected with the second terminal, and connecting means for connecting the output of the amplifier directly to the input of the feedback circuit by the detected output from the detecting means without passing through the CR circuit.

7 Claims, 3 Drawing Figures

SIGNAL AMPLIFYING APPARATUS

BACKGROUND OF THE INVENTION

1. Field of the Invention

The present invention relates to a signal amplifying apparatus, for example, an audio signal amplifying apparatus, which amplifies a signal, for example, an audio signal and supplies the amplified signal to a load, for example, a speaker by way of a cord.

2. Description of the Prior Art

Heretofore there have been proposed a variety of signal amplifying apparatus of this kind.

FIG. 1 shows an example of conventional audio signal amplifiers, which is provided with an amplifier 1. The amplifier 1 has a first input 2 for an audio signal to be amplified, a second input 3 for a feedback signal and an output 4 for an amplified audio signal. The amplifier 1 is further provided with a grounded terminal 5 common to the first and second inputs 2 and 3 and the output 4. The amplifier 1 has the construction of an operational amplifier and derives across the output 4 and the common terminal 5 an output signal of the same polarity as an input signal which is applied across the first input 2 and the common terminal 5 and an output signal reverse in polarity from an input signal which is applied across the second input 3 and the terminal 5.

Furthermore, the amplifying apparatus has a pair of input terminals 6 and 7 across which is supplied an audio signal to be amplified. The input terminal 6 is connected to the first input 2 and grounded via an input register 8. This input terminal 7 is directly grounded.

The amplifying apparatus is further provided with a feedback circuit 9, in which a series circuit of resistors 10 and 11 is connected at one end, as an input, to the output 4 of the amplifier 1 and grounded at the other end and the connection point of the resistors 10 and 11 is connected as an output to the second input 3 of the amplifier 1.

The amplifying apparatus is further provided with a terminal 12 connected with the output 4 of the amplifier 1 and a grounded terminal 13. The terminal 12 is for connection with a cord 17 which is connected with the one terminal 15 of a speaker 14. The terminal 13 is for connection with a cord 18 which is connected with the other terminal 16 of the speaker 14.

According to the apparatus of FIG. 1, when an audio signal is applied across the input terminals 6 and 7, it is supplied across the first input 2 and the common terminal 5 of the amplifier 1, wherein it is amplified and the amplified audio signal is provided across the output 4 and the ground. A portion of the amplified audio signal is fed back across the input 3 and the common terminal 5 of the amplifier 1 via the feedback circuit 9, constituting a first negative feedback loop. Accordingly, a stable audio signal of good quality is obtained between the output 4 of the amplifier 1 and the ground. This amplified audio signal is also obtained across the terminals 12 and 13.

In the apparatus of FIG. 1, in the case where the terminals 12 and 13 are connected with the terminals 15 and 16 of the speaker 14 by way of the cords 17 and 18, respectively, the speaker 14 is driven by the amplified audio signal to produce a stable sound.

FIG. 2 illustrates another example of the conventional audio signal amplifying apparatus. In FIG. 2, the parts corresponding to those in FIG. 1 are identified by the same reference numerals and no detailed description will be repeated. This prior example differs from the example of FIG. 1 in the following points: The resistor 10 constituting the feedback circuit 9 is disconnected from the output 4 of the amplifier 1, that is, the input of the feedback circuit 9 is disconnected from the output 4 of the amplifier 1 and a terminal 21 is provided which is connected with the input of the feedback circuit 9. Along with this, the terminal 7, one end of the input resistor 8 and one end of the resistor 11 forming the feedback circuit 9, that is, a grounding point common to the input and output of the feedback circuit 9, are disconnected from the ground and a terminal 22 is provided which is connected to the terminal 7, one end of the input resistor 8 and the grounding point of the feedback circuit 9. The terminals 21 and 22 are for connection with cords 23 and 24 which are connected with the terminals 15 and 16 of the speaker 14, respectively. Further, a CR parallel circuit 29 of a high-pass capacitor 25 and a resistor 27 is connected between the terminals 12 and 21 and a CR parallel circuit 30 of a high-pass capacitor 26 and a resistor 28 is connected between the terminals 13 and 22.

With the arrangement shown in FIG. 2, an audio signal to be supplied across the input terminals 6 and 7 is provided across the first input 2 and the grounded common terminal 5 of the amplifier 1 via the terminal 22 and the cords 24 and 18. The audio signal is amplified by the amplifier 1, the output from which is derived across the output 4 and the ground. The amplified audio signal is also obtained between the terminals 12 and 13. In the case where the terminals 12 and 13 are connected with the inputs 15 and 16 of the speaker 14 by way of the cords 17 and 18, respectively, the speaker 14 is driven by the amplified audio signal. In the case where the terminals 21 and 22 are connected with the input terminals 15 and 16 of the speaker 14 via the cords 23 and 24, respectively, the output 4 of the amplifier 1 is grounded via the terminal 12, the cords 17 and 23, the terminal 21, the input, the resistors 10 and 11 and the grounding point of the feedback circuit 9, the terminal 22, the cords 24 and 18 and the terminal 13, so that a portion of the amplified audio signal supplied with the speaker 14 is fed back across the input 3 and the terminal 5 of the amplifier 1 via the feedback circuit 9 and cords 17, 18, 23 and 24. Accordingly, there is set up a second negative feedback loop including the feedback circuit 9 and the cords 17, 18, 23 and 24. Further, since the output 4 of the amplifier 1 is grounded via the CR parallel circuit 29 of the capacitor 25 and the resistor 27, the input, resistors 10 and 11 and the grounding point of the feedback circuit 9 and the CR parallel circuit 30 of the capacitor 26 and the resistor 28, a portion of the amplified audio signal from the amplifier 1 is fed back across the input 3 and the terminal 5 of the amplifier 1 via the feedback circuit 9 and the parallel circuits 29 and 30. In consequence, there is established a third negative feedback loop including the feedback circuit 9 and the CR parallel circuits 29 and 30. The capacitor 25 and 26 of the CR parallel circuits 29 and 30 passes on to the third negative loop those unnecessary components contained in the amplified audio signal from the amplifier 1 which have higher frequencies outside of the audio frequency band.

Accordingly, in the apparatus of FIG. 2, an amplified audio signal of good quality, as compared with the amplified audio signal in the case of FIG. 1, is supplied to the speaker 14, producing a sound of good quality as compared with the sound obtainable with the apparatus of FIG. 1.

With the apparatus of FIG. 2, however, in the case where the cords 23 and 24 connected with the terminals 15 and 16 of the speaker 14 are not connected with the terminals 21 and 22, respectively, although the cords 17 and 18 connected with the terminals 15 and 16 of the speaker 14 are connected with the terminals 12 and 13, respectively, the aforesaid second negative feedback loop including the feedback circuit 9 and the cords 17, 18, 23 and 24 is not formed and consequently the negative feedback loop of the amplifier 1 becomes only the third negative feedback loop including the feedback circuit 9 and the CR parallel circuits 29 and 30. This causes a great change in the feedback constant of the negative feedback loop of the amplifier 1 to degrade the frequency-response characteristic of the amplifier 1, resulting in unnecessary low-frequency oscillation being developed or the stability of operation of the amplifier 1 being impaired.

SUMMARY OF THE INVENTION

It is therefore an object of the present invention to provide a novel audio signal amplifying apparatus which is based on the conventional signal amplifying apparatus of Fig. 2 but free from the defects mentioned above in respect of FIG. 2 even if there is a case similar to that where the cords 23 and 24 connected with the speaker 14 are not connected to the terminals 21 and 22.

According to an aspect of the present invention, in a case similar to that where the cords 17 and 18 connected with the speaker 14 are connected to the terminals 12 and 13 and the cords 23 and 24 connected to the speaker 14 are connected to the terminals 21 and 22 in the apparatus of FIG. 2, there is obtained a connection equivalent to such a connection that the cords 17 and 18 connected with the speaker 14 are connected with the terminals 12 and 13 and the cords 23 and 24 connected with the speaker 14 are connected with the terminals 21 and 22 in the apparatus of FIG. 2. Accordingly, in this case, an amplified audio signal of good quality as in the case of the apparatus of FIG. 2 is supplied to the speaker 14. However, even if there is a case similar to that where the cords 17 and 18 connected with the speaker 14 are connected with the terminals 12 and 13 but the cords 23 and 24 connected with the speaker 14 are not connected with the terminals 21 and 22 in the apparatus of FIG. 2, there is obtained a connection equivalent to such a connection that the cords 17 and 18 connected with the speaker 14 are connected with the terminals 12 and 13 in the apparatus of FIG. 1. Accordingly, in this case there is no such fear as mentioned previously in respect of FIG. 2 and an amplified audio signal is supplied stably to the speaker 14 as in the case of the apparatus of FIG. 1.

Other objects, features and advantages of the present invention will become more fully apparent from the following detailed description taken in conjunction with the accompanying drawings.

DESCRIPTION OF THE PREFERRED EMBODIMENTS

Figure 2:
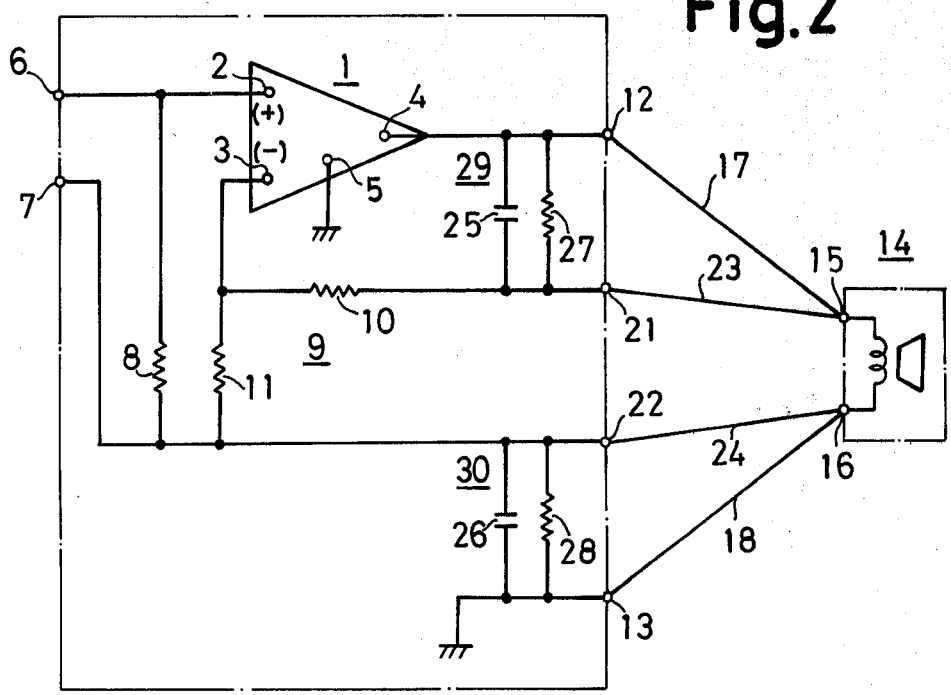
FIG. 2 is a connection diagram showing another prior art example on which is based an embodiment of the signal amplifying apparatus of the present invention.
Figure 3:
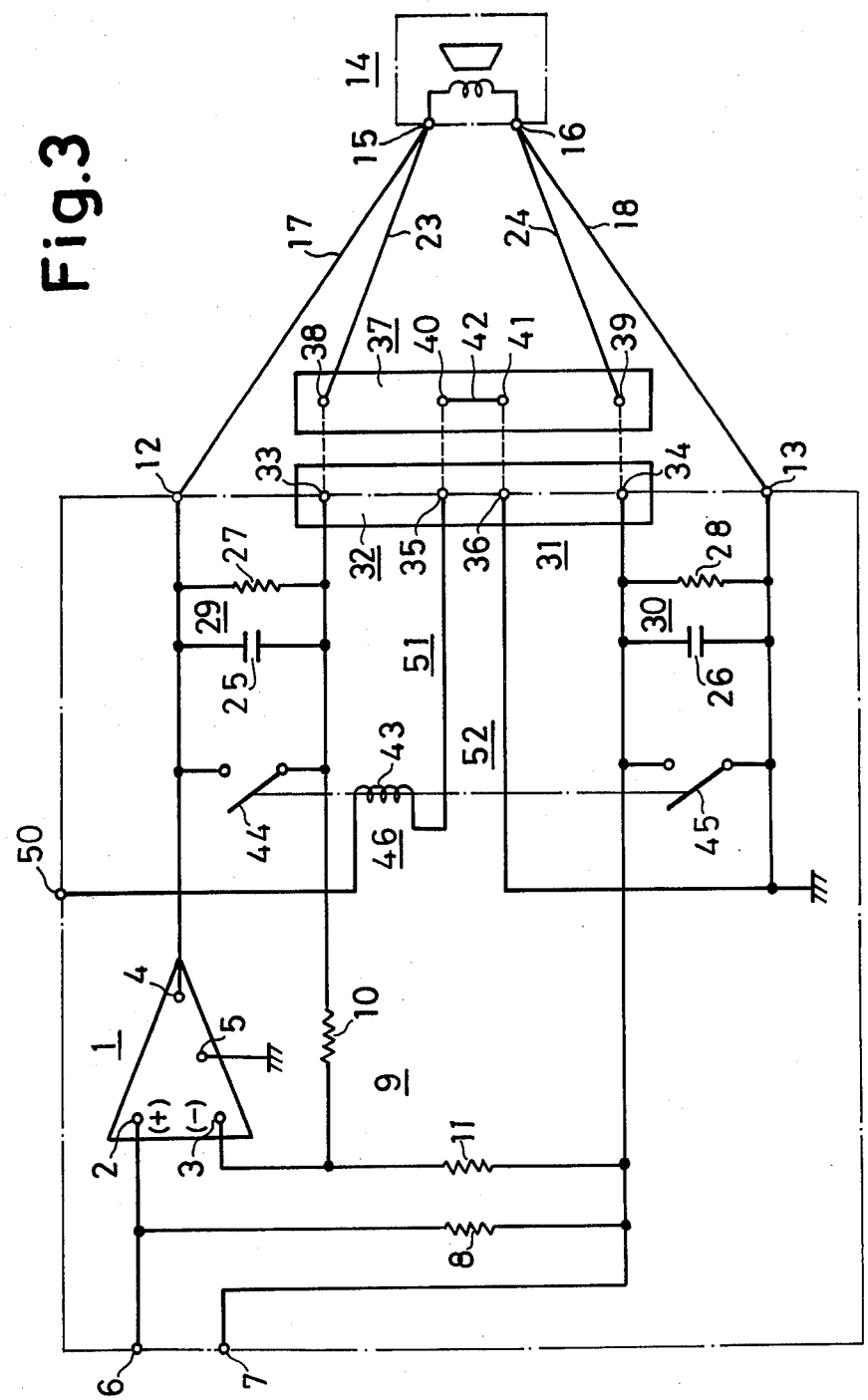
FIG. 3 is a connection diagram illustrating an embodiment of the signal amplifying apparatus of the present invention.

FIG. 3 illustrates an embodiment of the present invention as being applied to a signal amplifying apparatus, in which the parts corresponding to those in FIG. 2 are identified by the same reference numerals and no detailed description will be repeated.

The signal amplifying apparatus of FIG. 3 is identical in construction with the prior art example of FIG. 2 except the following points:

The embodiment of FIG. 3 has connecting means 31, an example of which has a multiple connector female 32. The multiple connector female 32 is provided with four pin receptacles 33, 34, 35 and 36. The pin receptacle 33 corresponds to the terminal 21 used in FIG. 2 and accordingly it is connected with the input of the feedback circuit 9. The pin receptacle 34 corresponds to the terminal 22 in FIG. 2 and accordingly it is connected with the input terminal 7, the input resistor 8 and one end of the resistor 11 of the feedback circuit 9, that is, its grounding point.

The multiple connector female 32 is designed to be coupled with a multiple connector male 37. The multiple connector male 37 has pins 38, 39, 40 and 41 which are inserted into the pin receptacles 33, 34, 35 and 36 of the multiple connector female 32 for electrical connection therewith. The pins 38 and 39 of the multiple connector male 37 are adapted so that they may be connected at one end with the cords 23 and 24 connected with the terminals 15 and 16 of the speaker 14, respectively. The pins 40 and 41 are interconnected by means of a wire 42.

Further, there is provided a relay 46 which has a solenoid 43 and normally closed contacts 44 and 45 which are opened by the energization of the solenoid 43. The solenoid 43 of the relay 46 is connected at one end with a power source terminal 50 and connected at the other end with the pin receptacle 35 of the multiple connector female 32. The pin receptacle 36 of the multiple connector female 32 is grounded. The contact 44 of the relay 46 is connected in parallel with the CR parallel circuit 29 of the capacitor 25 and the resistor 27 and the contact 45 is connected in parallel with the CR parallel circuit 30 of the capacitor 26 and the resistor 28. In the case where the multiple connector female 32 is coupled with the multiple connector male 37, a current flows in the solenoid 43 from the power source terminal 50 via the pin receptacle 35 of the multiple connector female 32, the pin 40, the wire 42 and the pin 41, of the multiple connector male 37, the pin receptacle 36 of the multiple connector female 32 and the ground, energizing the solenoid 43. Therefore, when the multiple connector male 37 is coupled with the multiple connector female 32, the contacts 44 and 45 of the relay 46 are opened, so that the CR parallel circuit 29 of the capacitor 25 and the resistor 27 and the CR parallel circuit 30 of the capacitor 26 and the resistor 28 are not shorted. In the case where the multiple connector male 37 is not coupled with the multiple connector female 32, however, the abovesaid current path is cut off, flowing no current in the solenoid 43. Therefore, the solenoid 43 is not energized. In consequence, when the multiple connector male 37 is not coupled with the multiple connector female 32, the contacts 44 and 45 remain closed, so that the CR parallel circuit 29 of the capacitor 25 and the resistor 27 and the CR parallel circuit 30 of the capacitor 26 and the resistor 28 are shorted.

In the case where the multiple connector male 37 is coupled with the multiple connector female 32, in such a state that the cords 23 and 24 are connected with the pins 38 and 39, respectively, the input of the feedback circuit 9 is connected with the cord 23 via the pin receptacle 33 of the multiple connector female 32 and the pin 38 of the multiple connector male 37 and one end of the resistor 11 of the feedback circuit 9 on the side of the ground, that is, the grounding point, is connected with the cord 24 via the pin receptacle 34 of the multiple connector female 32 and the pin 39 of the multiple connector male 37. Where the multiple connector male 37 is not connected with the multiple connector female 32, however, the connections described just above are not obtained.

The connecting means 31, that is, the multiple connector female 32, the multiple connector male 37 and the solenoid 43 of the relay 46 constitute means 51 for detecting whether the cord 23 is connected with the pin receptacle 33 of the multiple connector female 32 serving as a terminal to be connected with the input of the feedback circuit 9 and whether the cord 24 is connected with the pin receptacle 34 of the multiple connector female 32 serving as a terminal to be connected with one end of the feedback circuit 9 on the side of the ground, i.e. the grounding point. In the case where the multiple connector male 37 is coupled with the multiple connector female 32, with the cords 23 and 24 connected with the pins 38 and 39 respectively, the detecting means 51 detects the connection of the cords 23 and 24 with the input of the feedback circuit 9. In the case where the multiple connector male 37 is not coupled with the multiple connector female 32, however, the detecting means 51 detects the disconnection of the cords 23 and 24 from the feedback circuit 9 regardless of whether the cords 23 and 24 are connected with the pins 38 and 39 of the multiple connector male 37. Further, the solenoid 43 and the contacts 44 and 45 of the relay 46 constitute means 52 for connecting the output 4 of the amplifier 1 directly with the input of the feedback circuit 9 without passing through the CR parallel circuits 29 and 30 by the output from the detecting means 51. When the output from the detecting means 51 is not indicative of the aforesaid connection of the cords 23 and 24 with the input of the feedback circuit 9, the connector means 52 connects the output 4 of the amplifier 1 to the input of the feedback circuit 9 via the parallel circuits 29 and 30. When the output from the detecting means 51 is indicative of the disconnection of the cords 23 and 24 from the input of the feedback circuit 9, however, the connecting means 52 connects the output 4 of the amplifier 1 directly to the input of the feedback circuit 9 without passing through the parallel circuits 29 and 30.

With the arrangement of the signal amplifying apparatus of the present invention shown in FIG. 3, in the case where the cords 17 and 18 connected with the terminals 15 and 16 of the speaker 14 are connected to the terminals 12 and 13, respectively, and the multiple connector male 37 is connected to the multiple connector female 32 of the connecting means 31, with the cords 23 and 24 connected to the pins 38 and 39, the detecting means 51 yields the detected output indicating the connection of the cords 23 and 24 with the input of the feedback circuit 9, so that the contacts 44 and 45 of the connecting means 52 are open. Accordingly, in this case, when an audio signal is supplied across the input terminals 6 and 7, it is applied across the first input 2 of the amplifier 1 and the grounded common terminal 5 via the pin receptacle 34 of the multiple connector female 32, the pin 39 of the multiple connector male 37, the cords 24 and 18 and the terminal 13 and the audio signal is amplified by the amplifier 1 and derived across the output 4 and the ground. The amplified audio signal is also obtained across the terminals 12 and 13 and supplied via the cords 17 and 18 to the speaker 14 to drive it. Further, the connecting means 52 connects the output 4 of the amplifier 1 with the input of the feedback circuit 9 not directly but via the CR parallel circuits 29 and 30. Accordingly, in this case the output 4 of the amplifier 1 is grounded via the terminal 12, the cords 17 and 23, the pin 38 of the multiple connector male 37, the pin receptacle 33 of the multiple connector female 32, the input, the resistors 10 and 11 and the grounding point of the feedback circuit 9, the pin receptacle 34 of the multiple connector female 32, the pin 39 of the multiple connector male 37, the cords 24 and 18 and the terminal 13, while the connection point of the resistors 10 and 11 of the feedback circuit 9 is connected with the input 3 of the amplifier 1. Accordingly, a portion of the amplified audio signal which is supplied to the speaker 14 is fed back across the input 3 and the common terminal 5 of the amplifier 1. As a result of this, there is formed a fourth negative feedback loop including the feedback circuit 9 and the cords 17, 18, 23 and 24. Moreover, the output 4 of the amplifier 1 is grounded via the CR parallel circuit 29 of the capacitor 25 and the resistor 27, the input, the resistors 10 and 11 and the grounding point of the feedback circuit 9 and the CR parallel circuit 30 of the capacitor 26 and the resistor 28, while the connection point of the resistors 10 and 11 of the feedback circuit 9 is connected with the input 3 of the amplifier 1. Accordingly, a portion of the amplified audio signal from the amplifier 1 is fed back across the input 3 and the terminal 5 of the amplifier 1 via the feedback circuit 9 and the CR parallel circuits 29 and 30. In consequence, a fifth negative feedback loop is set up including the feedback circuit 9 and the CR parallel circuits 29 and 30.

The fourth and fifth negative feedback loops are equivalent to the second and third negative feedback which are formed in the case where the cords 17, 18 and 23, 24 connected with the terminals 15 and 16 of the speaker 14, respectively, are connected to the terminals 12, 13 and 21, 22 in the conventional signal amplifying apparatus of FIG. 2. Accordingly, in the event that the cords 17 and 18 connected with the terminals 15 and 16 of the speaker 14, respectively, are connected to the terminals 12 and 13 and the multiple connector male 37 is coupled with the multiple connector female 32 of the connecting means 31 with the cords 23 and 24 connected to the pins 38 and 39 of the multiple connector male 37, there is obtained in the signal amplifying apparatus of the present invention a connection equivalent to that obtained when the cords 17, 18 and 23, 24 connected with the terminals 15 and 16 of the speaker 14 are connected to the terminals 12, 13 and 21, 22, respectively, in the prior art apparatus of FIG. 2. Therefore, in this case an audio signal of good quality is supplied to the speaker 14 as described previously in respect of FIG. 2, producing a sound of good quality.

Furthermore, with the arrangement of the signal amplifying apparatus shown in FIG. 3, the cords 17 and 18 connected with the terminals 15 and 16 of the speaker 14 are connected to the terminals 12 and 13 but, in the case where the multiple connector male 37 is not coupled with the multiple connector female 32 of the connecting means 31, the detecting means 51 provides the detected output representing the disconnection of the cords 23 and 24 from the input of the feedback circuit 9 regardless of whether the cords 23 and 24 are connected with the pins 38 and 39 of the multiple connector male 37. Accordingly, the contacts 44 and 45 of the connecting means 52 remain closed. Therefore, in this case, when the audio signal is supplied across the input terminals 6 and 7, the audio signal is provided across the first input 2 and the grounded common terminal 5 of the amplifier 1 via the contact 45 of the connecting means 52. The audio signal is amplified by the amplifier 1 and derived across its output 4 and the ground. The amplified audio signal is also obtained across the terminals 12 and 13 and provided via the cords 17 and 18 to the speaker 14 to drive it. Moreover, the contacts 44 and 45 of the connecting means 52 connect the output 4 of the amplifier 1 directly to the input of the feedback circuit 9 without passing through the CR parallel circuit 29 of the capacitor 25 and the resistor 27 and the CR parallel circuit 30 of the capacitor 26 and the resistor 28. Consequently in this case the output 4 of the amplifier 1 is grounded via the contact 44 of the connecting means 52, the input, the resistors 10 and 11 and the grounding point of the feedback circuit 9 and the contact 45 of the connecting means 52 without passing through the CR parallel circuit 29 of the capacitor 25 and the resistor 27 and the CR parallel circuit 30 of the capacitor 26 and the resistor 28. On the other hand, the connection point of the resistors 10 and 11 of the feedback circuit 9 is connected with the input 3 of the amplifier 1. Accordingly, a portion of the amplified audio signal from the amplifier 1 is fed back across the input 3 and the common terminal 5 of the amplifier 1. Thus a six negative feed back loop is established including the feedback circuit 9 but not including the CR parallel circuits 29 and 30. The sixth negative feedback loop is equivalent to the first negative feedback loop formed in the prior art signal amplifying apparatus of FIG. 1.

Figure 1:
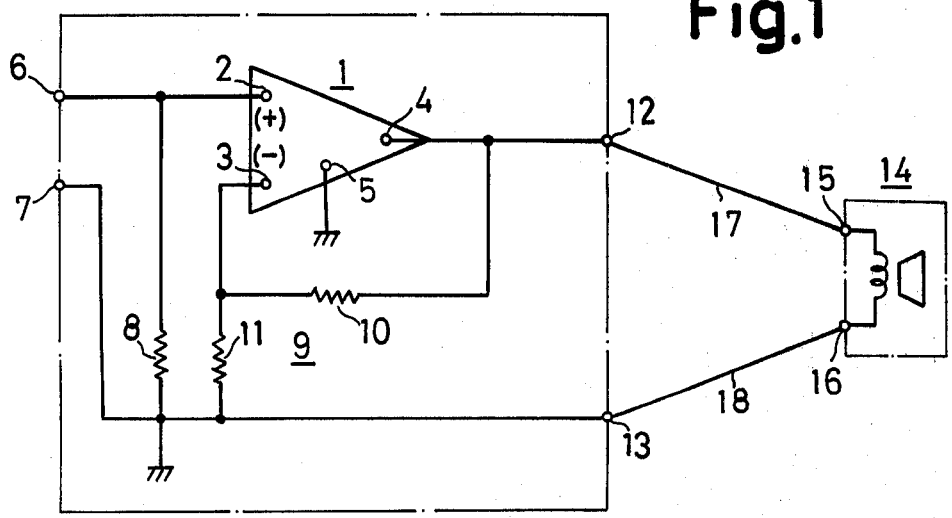
FIG. 1 is a connection diagram showing a prior art example of the signal amplifying apparatus.

Accordingly, in the case where the multiple connector male 37 is not coupled with the multiple connector female 32 of the connecting means 31, and consequently where the cords 23 and 24 are not connected with the terminals 33 and 34 of the multiple connector female 32, there is obtained a connection which is equivalent to that obtained in the case where the terminals 15 and 16 of the speaker 14 are connected with the terminals 12 and 13 in the conventional signal amplifying apparatus of FIG. 1. Therefore, in this case the amplified audio signal is supplied stably to the speaker 14 to achieve stable sound reproduction as is the case with FIG. 1.

While the foregoing has described an embodiment of the audio signal amplifying apparatus of the present invention which is based on the prior art apparatus of FIG. 2, it is also possible to employ various known structures for the amplifier 1, the feedback circuit 9 and for the CR parallel circuits 29 and 30. The CR parallel circuits 29 and 30 need not always be of parallel connection. Also it is possible to replace with each other the multiple connector female 32 forming the connecting means 31 and the multiple connector m... ...rthermore, it is also possible to adopt such an arrangement in which the solenoid 43 of the detecting means 52 is a transistor circuit including a transistor which is connected with the pin receptacles 35 and 36 of the multiple connector female 32 and operates in the case of the multiple connector male 37 being coupled with the multiple connector female 32 and the contacts 44 and 45 are formed by switching transistors which are controlled by the output from the transistor circuit. And various other modifications can be effected.

Moreover, the foregoing description has been given in connection with the case where the load of the signal amplifying apparatus is a speaker but it will be understood that the same results as described in the foregoing are similarly obtainable even if the load is a signal amplifying apparatus of the next stage.

Besides, although the present invention has been described above as being applied to the audio signal amplifying apparatus, it will be seen that the invention is also applicable to video signal amplifying apparatus.

It will be apparent that many modifications and variations may be effected without departing from the scope of the novel concepts of this invention.

What is claimed is:

1. In a signal amplifying apparatus which is provided with an amplifier, a feedback circuit having its input and output connected with the output and input of the amplifier, a first terminal connected with the output of the amplifier for connection with a first cord connected with the input of a load, and a second terminal connected with the input of the feedback circuit for connection with a second cord connected with the input of the load, the improvement comprising:
    means for detecting whether the second cord is connected with the second terminal; and
    means for coupling the output of the amplifier with the input of the feedback circuit by the detected output from the detecting means.

2. A signal amplifying apparatus according to claim 1 wherein the input of the feedback circuit is connected to the output of the amplifier via a CR circuit and the CR circuit is shorted by the coupling means.

3. A signal amplifying apparatus according to claim 1 wherein the amplifier has a first input for a signal to be amplified, a second input for a feedback signal and an output for an amplified signal and the input and output of the feedback circuit are connected with the output and the second input of the amplifier, respectively.

4. A signal amplifying apparatus according to claim 3 wherein the input of the feedback circuit is connected via a CR circuit with the output of the amplifier.

5. A signal amplifying apparatus according to claim 1 wherein the detecting means has connecting means for connecting the second terminal with the second cord.

6. A signal amplifying apparatus according to claim 1 wherein the detecting means has connecting means for connecting the second terminal with the second cord and a relay solenoid connected with the connecting means.

7. A signal amplifying apparatus according to claim 1 wherein the connecting means is a relay contact.

* * * * *